United States Patent [19]

Suga et al.

[11] Patent Number: 4,821,105

[45] Date of Patent: Apr. 11, 1989

[54] IMAGE PICKUP APPARATUS

[75] Inventors: Akira Suga; Takao Kinoshita, both of Tokyo; Shinji Sakai; Akihiko Tojo, both of Yokohama, all of Japan

[73] Assignee: Canon Kabushiki Kaisha, Tokyo, Japan

[21] Appl. No.: 196,853

[22] Filed: May 17, 1988

Related U.S. Application Data

[63] Continuation of Ser. No. 106,023, Oct. 8, 1987, abandoned, which is a continuation of Ser. No. 690,205, Jan. 10, 1985, abandoned, which is a continuation of Ser. No. 14,784, Feb. 13, 1987, abandoned, which is a continuation of Ser. No. 129,946, Nov. 25, 1987, abandoned.

[30] Foreign Application Priority Data

| Jan. 18, 1984 | [JP] | Japan | 59-7772 |
| Jan. 20, 1984 | [JP] | Japan | 59-8778 |
| Jan. 23, 1984 | [JP] | Japan | 59-10509 |

[51] Int. Cl.$^4$ ............................................. H04N 3/14
[52] U.S. Cl. ........................... 358/213.19; 358/213.31
[58] Field of Search ............ 358/212, 213.16, 213.19, 358/213.26, 213.31; 357/241 LR; 377/57; 307/311

[56] References Cited

U.S. PATENT DOCUMENTS

| 3,996,600 | 12/1976 | Patrin | 357/24 LR |
| 4,229,752 | 10/1980 | Hynecek | 357/24 |
| 4,242,599 | 12/1980 | Suzuki | 357/24 LR |
| 4,328,432 | 5/1982 | Yamazaki | 357/24 LR |
| 4,462,047 | 7/1984 | Fujimoto et al. | 358/212 |
| 4,485,315 | 11/1984 | Collet et al. | 357/24 LR |
| 4,622,596 | 11/1986 | Suga et al. | 358/335 |
| 4,644,403 | 2/1987 | Sakai et al. | 358/213 |
| 4,663,669 | 5/1987 | Kinoshita et al. | 358/213.19 |
| 4,723,169 | 2/1988 | Kaji | 358/213.31 |

FOREIGN PATENT DOCUMENTS

| 3104489 | 12/1981 | Fed. Rep. of Germany. |
| 3405808 | 8/1984 | Fed. Rep. of Germany. |

OTHER PUBLICATIONS

Jaroslav Hynecek, "Electron-Hole Recombination Antiblooming for Virtual-Phase CCD Imager", IEEE Transactions on Electron Devices, vol. ED-30, No. 8, pp. 941-948, (Aug. 1983).

Primary Examiner—Jin F. Ng
Assistant Examiner—Stephen Brinich
Attorney, Agent, or Firm—Fitzpatrick, Cella, Harper & Scinto

[57] ABSTRACT

An image pickup apparatus comprises: first and second areas for converting an incident light to charges; a recombining electrode for allowing a part of the charges in the second area to be recombined with majority carriers; and a control circuit for allowing the charges to be respectively stored in the first and second areas and also making the recombining electrode operative, and for controlling the first and second areas and the recombinating electrode in such a manner that there is a relation of $A_{INT} < D_{INT}$ between an amount $A_{INT}$ of charges stored in the first area and an amount $D_{INT}$ of residual charges which are not recombined in the second area. Thus, an interlacing effect and a strong blooming-prevention effect are obtained. Further, the image pickup apparatus has a suppressing device for suppressing a part of added information of the charges in the first and second areas, so that the dynamic range of luminance can be widened.

55 Claims, 15 Drawing Sheets

IMAGE PICKUP APPARATUS

This application is a continuation of application Ser. No. 106,023 filed Oct. 8, 1987, which in turn is a continuation of application Ser. No. 690,205, filed Jan. 10, 1985, both now abandoned, which is a continuation of Ser. No. 014,784, filed on Feb. 13, 1987, now abandoned, which is a continuation of Ser. No. 129,946 filed Nov. 25, 1987, now abandoned.

FIELD OF THE INVENTION

The present invention relates to an image pickup apparatus in which blooming can be effectively suppressed and an interlacing effect can be obtained.

BACKGROUND OF THE INVENTION

Conventionally, as disclosed in the Official Gazette of Japanese Laid Open Patent Application No. 138371/1981, in a solid state image sensor such as a CCD or the like, there has been considered a method whereby excessive carriers are extinguished using surface recombination for prevention of blooming in place of providing overflow drains in the light receiving surface.

This method has advantages such that sensitivity is high since the opening ratio of the light receiving surface is not sacrificed and horizontal resolution power is raised since the degree of integration can be improved, and the like.

FIGS. 1 to 3 are diagrams for explaining such a blooming preventing method using surface recombination, in which FIG. 1 is a front view showing an ordinary frame transfer type CCD.

In the diagram, a light receiving part 1 consists of a plurality of vertical transfer registers having photosensitivity.

A storage part 2 consists of a plurality of vertical transfer registers which are shielded against the light.

A reference numeral 3 denotes a horizontal transfer register. The information in each vertical transfer register in the storage part 2 can be stored in this horizontal transfer register by simultaneously shifting it by one bit. Then, by allowing the register 3 to perform the horizontal transfer operation, a video signal can be derived from an output amplifier 4.

In general, the information formed in each vertical transfer register in the light receiving part 1 is transferred vertically to the storage part 2 within a vertical blanking interval based on the standard television system and is sequentially read out line by line by the horizontal transfer register 3 within the next vertical scan interval.

It is now assumed that the light receiving part 1, storage part 2 and horizontal transfer register 3 are each two-phase driven and respective transfer electrodes are indicated by $P_1$, $P_2$, $P_3$, $P_4$, $P_5$, and $P_6$, and respective transfer clocks are represented by ($\phi_{p1}$, $\phi_{p2}$), ($\phi_{p3}$, $\phi_{p4}$) and ($\phi_{p5}$, $\phi_{p6}$).

FIG. 2 is a diagram showing a potential profile below such transfer electrodes $P_1$ to $P_6$. For example, a low-potential portion and a high-potential portion (as "seen" by electrons) are formed by means of ion implantation or the like below each electrode, which is provided over a P-type silicon substrate 6 and separated therefrom by an insulation layer 5. For instance, when a voltage $-V_1$ at a low level is applied to the electrodes $P_2$, $P_4$ and $P_6$ and a voltage $V_2$ at a high level is applied to the electrodes $P_1$, $P_3$ and $P_5$, potentials as indicated by a solid line in the diagram are formed. On the other hand, when a low-level voltage $V_1$ is applied to the electrodes $P_1$, $P_3$ and $P_3$ and the high-level voltage $V_2$ is applied to the electrodes $P_2$, $P_4$ and $P_6$, potentials as indicated by a broken line in the diagram are formed.

Therefore, by applying alternating voltages having mutually opposite phases to the electrodes $P_1$, $P_3$, $P_5$ and the electrodes $P_2$, $P_4$ and $P_6$, the carrier is sequentially transferred in one direction (to the right in the diagram).

On one hand, an alternate-long-and-short dash line in FIG. 2 indicates potentials in the case where a large positive voltage $V_3$ is applied to the electrodes. These potential wells are in the reversed state, so that excessive carriers over a predetermined amount will have been extinguished by recombining with the majority carriers.

FIG. 3 is a diagram showing the relation between the voltage applied to the electrodes and the shape of the internal potential as mentioned above with respect to the direction of thickness of the semiconductor substrate 6. It will be understood from the diagram that the potential wells are shallow for the electrode voltage $V_3$ and the excessive carrier enters the second state in that it can recombine with the majority carrier at the interface with the insulation layer.

On the other hand, the accumulation state as the first state occurs at the electrode voltage $-V_1$, so that the majority carrier can be easily collected around the interface and, for instance, this majority carrier can be supplied from a channel stopper area (not shown).

Therefore, for instance, by alternately applying the voltages $-V_1$ and $V_3$ to the electrode $P_1$ while a barrier is formed and maintained by applying the voltage $-V_1$ to the electrode $P_2$, the minority carrier which is accumulated below the electrode $P_1$ is limited to less than a predetermined amount.

However, such an arrangement as shown in FIG. 2 has the drawback that its efficiency in removal of the excessive charges is low. Namely, in transfer electrodes, transfer efficiency is generally improved by preventing the surface recombination of charges upon storage and transfer of charges. For this purpose, the potential well below the transfer electrode has to be sufficiently deep and the area of the bottom surface of the well has to be wide.

On the other hand, the opposite conditions are needed to efficiently recombine the charges.

That is, it is desirable that the area of the bottom surface of the potential well below the electrode be narrow to a certain extent so that the charges efficiently overflow and are recombined.

Consequently, in the conventional technology, there occurs a problem that an increase in transfer efficiency causes the efficiency in recombination to be deteriorated and, contrarily, an increase in recombination efficiency results in a decrease in transfer efficiency.

In addition, in such a CCD using charge recombination, there is a problem that the clock for recombination is mixed with the output signal and becomes noise of a fixed pattern. Therefore, a conventional apparatus is arranged such that the recombination clock is supplied only during the horizontal blanking interval.

In such a CCD of the conventional type, the frame transfer is started within the vertical blanking interval, therefore, the generation of the recombination clock is stopped during the interval of, e.g., about $\frac{1}{2}$H (horizontal interval) immediately before that interval. Thus, a charge transfer is started in the state in which a great amount of charges has been stored, which may cause a smear phenomenon or blooming phenomenon. Therefore, a method whereby the device is driven even during the vertical blanking interval is also considered. However, this method is undesirable because of the problem of large electric power consumption or the like.

SUMMARY OF THE INVENTION

It is an object of the present invention to eliminate the foregoing drawbacks in the conventional technology and to provide an image pickup apparatus in which transfer efficiency and recombination efficiency are high and an interlacing effect is derived.

It is another object of the present invention to provide an image pickup apparatus in which the blooming or smear can be prevented by performing the recombining operation for a predetermined interval immediately before the frame transfer without an increase in electric power consumption and which is also effective even in the case where the charge transfer is exceptionally performed in other intervals than the vertical blanking interval.

It is still another object of the invention to provide an image pickup apparatus with less noise and less electric power consumption.

To accomplish the above objects, an image pickup apparatus of an embodiment according to the present invention comprises: first and second areas for converting incident light to charges; recombining means for allowing a portion of the charges in the second area to be recombined with the majority carrier; and control means for allowing charges to be respectively stored in the first and second areas and also making the recombining means operative, and for controlling the first and second areas and the recombining means in a manner such that an amount $A_{INT}$ of charges stored in the first area and an amount $D_{INT}$ of charges which remain in the second area without being recombined satisfy the relation of $A_{INT} < D_{INT}$. Therefore, a blooming preventing capability can be raised and an interlacing effect can be also obtained.

An image pickup apparatus of another embodiment according to the present invention comprises: first and second areas for converting incident light to charges; recombining means for allowing a portion of the charges in the second area to be recombined with the majority carrier; control means for allowing charges to be respectively stored in the first and second areas and also making the recombining means operative, and for controlling the first and second areas and the recombining means in a manner such that an amount $A_{INT}$ of charges stored in the first area and an amount $D_{INT}$ of charges which remain in the second area without being recombined satisfy the relation of $A_{INT} < D_{INT}$; and suppressing means for suppressing a part of added information of the charges in the first and second areas. Therefore, deterioration in interlacing effect in case of high luminance can be made inconspicuous and an image pickup apparatus having high performance within a wide luminance range can be obtained.

An image pickup apparatus of another embodiment according to the present invention comprises: a light receiving part for converting an optical image to a charge signal; recombining means for allowing a portion of the charges in the light receiving part to be recombined with the majority carrier; and control means for forming a signal to allow the charge signal in the light receiving part to be transferred and for allowing the recombining means to perform the recombining operation for a predetermined time immediately before the transfer of the charge signal. Therefore, by supplying a pulse for charge recombination immediately before the frame transfer, the excessive charges stored until the start of frame transfer are reduced to a suitable value, thereby making it possible to prevent the blooming or smear which would otherwise occur because of the inability of all of the excessive charges to be transferred upon frame transfer.

In addition, it is possible to eliminate an increase in electric power consumption such as occurs in the case of operation during the vertical blanking interval.

Also, an image pickup apparatus of still another embodiment according to the present invention comprises: a light receiving part for converting an optical image to a charge signal; recombining means for allowing a portion of the charges in the light receiving part to be recombined with the majority carrier; a storage part for storing the charge signal in the light receiving part; and control means for controlling the light receiving part including the recombining means in a manner such that the potential state in the light receiving part becomes a predetermined constant level during the time when the signal in the storage part is read out. Therefore, electrical power can be saved and no noise is mixed since $\phi_{AB}$ and $\phi_{PI}$ are set to constant potentials in the case of recording in the still mode.

On the other hand, since those potentials at this time are set to be lower than the potential at the storage part as "seen" by the electrons, even if blooming occurs in the light receiving part, it does not occur in the storage part.

Other objects and features of the present invention will become apparent from the following description with reference to the accompanying drawings.

DETAILED DESCRIPTION OF THE PREFERRED EMBODIMENTS

The present invention will now be described hereinbelow with respect to an embodiment.

Figure 4:
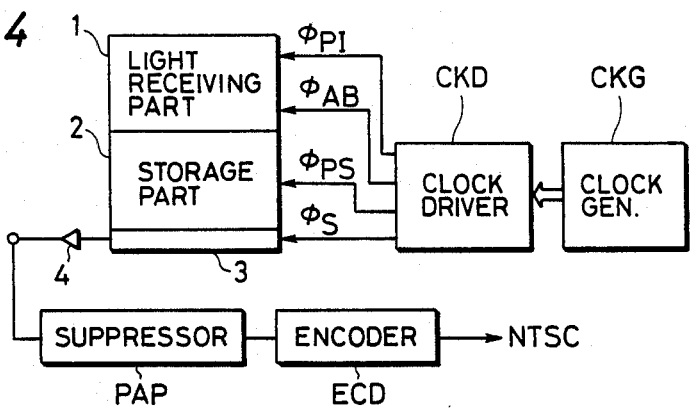
FIG. 4 is a diagram showing an example of an arrangement of an image pickup apparatus of the present invention.

FIG. 4 is a diagram showing an example of an image pickup apparatus using an image sensor according to the present invention. In this embodiment, a case of a frame transfer type CCD of the single-phase driving method will be explained.

Figure 1:
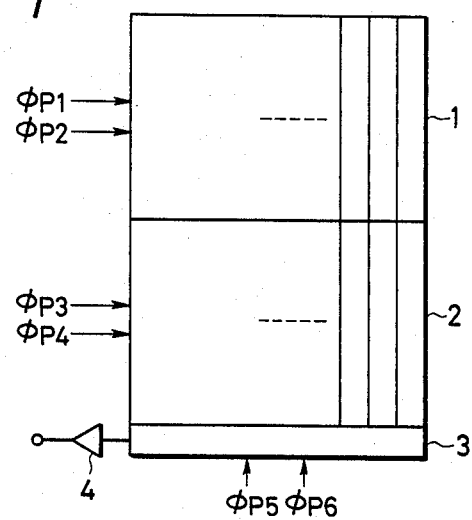
FIG. 1 is a schematic diagram showing a conventional CCD image sensor.
Figure 2:
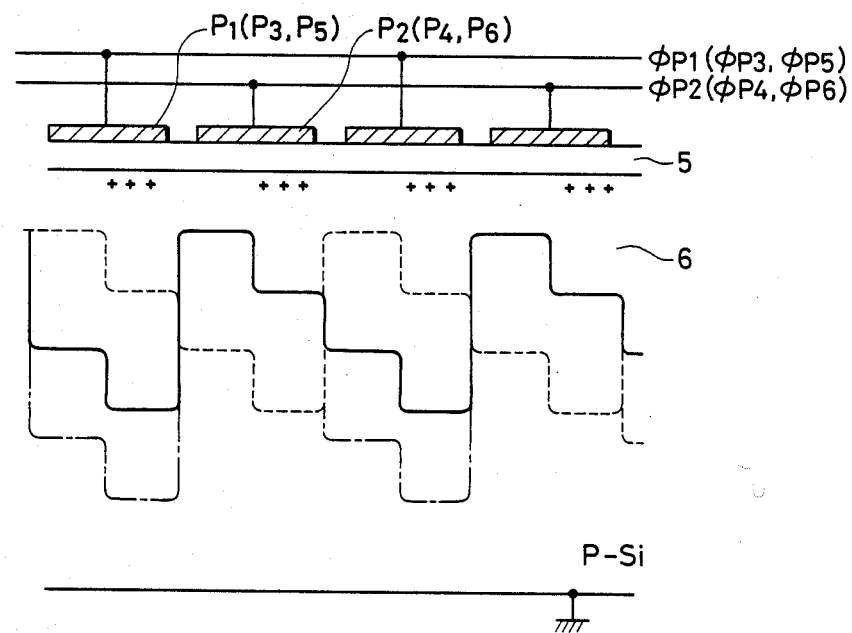
FIG. 2 is a diagram for explaining a method of driving the sensor shown in FIG. 1.
Figure 3:
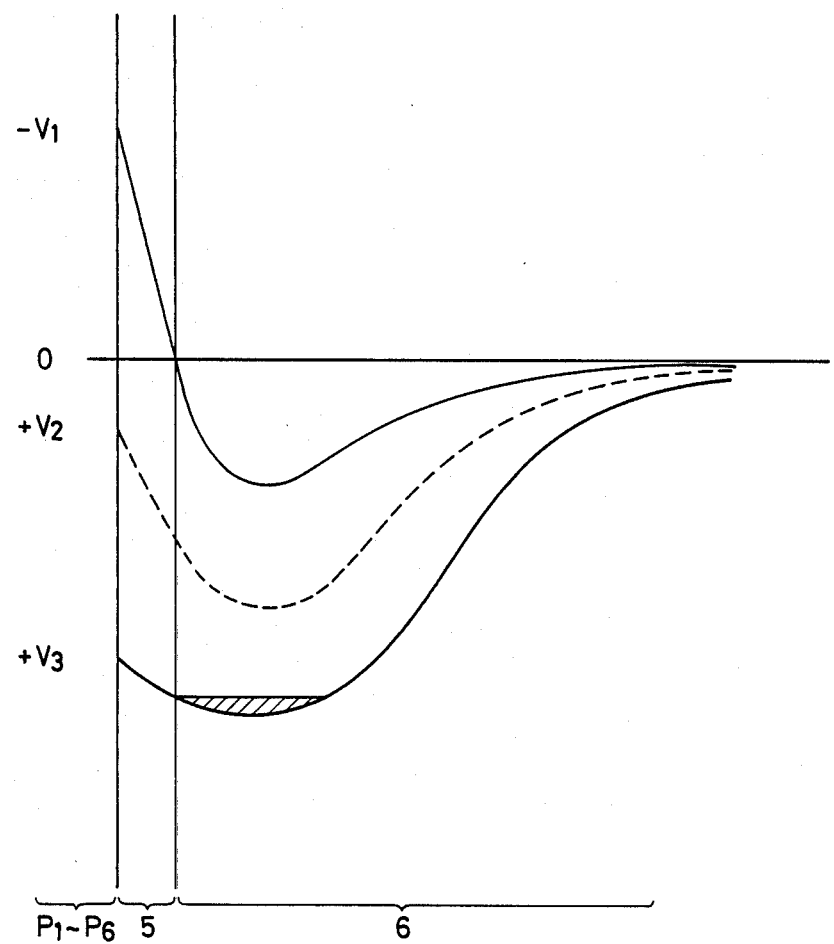
FIG. 3 is a diagram for explaining the principle of the surface charge recombination.

In the diagram, the similar parts and components as those shown in FIGS. 1 to 3 are designated by the same reference numerals.

In this embodiment, a clock $\phi_{AB}$ for allowing the excessive charges to be extinguished by recombining them with the holes at the center of the surface recombination is applied together with a transfer clock $\phi_{PI}$ to the light receiving part 1.

On the other hand, transfer clocks $\phi_{PS}$ and $\phi_S$ are respectively applied to the storage part 2 and horizontal transfer register 3.

A clock driver CKD serves as control means for supplying those clock pulses $\phi_{PI}$, $\phi_{AB}$, $\phi_{PS}$, $\phi_S$, etc., to the image sensor. A clock generator CKG generates timing signals to form those pulses. A processing amplifier (or suppressor) PAP serves as suppressing means and includes a KNEE circuit or a $\gamma$-converting circuit or the like to cut off or non-linearly suppress a signal over a predetermined level as will be explained later. An encoder ECD converts a video signal which is supplied through the suppressor PAP to a signal based on the standard television system such as, e.g., an NTSC signal.

Figure 5:
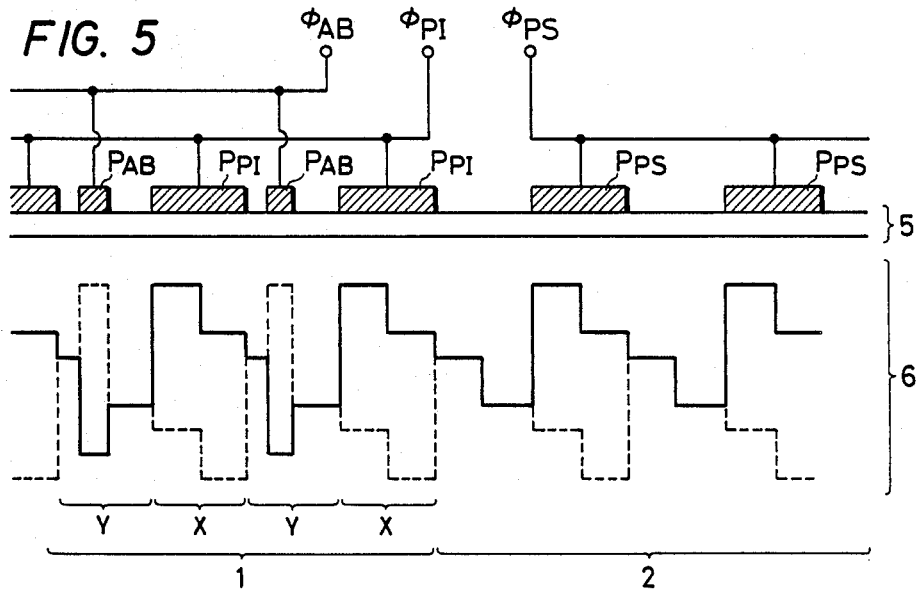
FIG. 5 is a cross sectional schematic diagram showing an example of a structure of an image sensor which is suitable for use in the image pickup apparatus of the present invention.

FIG. 5 is a diagram showing schematically structures of electrodes and potentials in the cross section in the boundary area between the light receiving part 1 and the storage part 2.

In the diagram, $P_{PI}$ denotes a transfer electrode to apply the transfer clock $\phi_{PI}$ to the light receiving part; $P_{AB}$ is a recombination control electrode serving as recombining means for applying the recombination clock $\phi_{AB}$; and $P_{PS}$ is a transfer electrode to apply the transfer clock $\phi_{PS}$ to the storage part. In the diagram, a solid line indicates the potential state in the case where low-level voltages are applied as the clock pulses $\phi_{PI}$ and $\phi_{PS}$ and high-level voltage is applied as the clock pulse $\phi_{AB}$. A broken line represents the potential state in the case where the pulses $\phi_{PI}$ and $\phi_{PS}$ are at a high level and the pulse $\phi_{AB}$ is at a low level.

Potential stairs as shown in the diagram are formed in a substrate SS due to ion implantation. On one hand, a P-type inverting layer, for instance, to constitute a virtual electrode (although they are not shown) is formed in the lower portion of the insulation layer that is not covered by the electrodes $P_{PI}$, $P_{PS}$ and $P_{AB}$, namely, in the boundary portion between the insulation layer and the semiconductor substrate. Therefore, the potential in the semiconductor area that is not covered by the electrode is not changed due to the bias to each electrode.

In the diagram, it is assumed that an area of X is a first area and an area of Y is a second area. As shown in the diagram, the second area indicates the area including the electrode $P_{AB}$. These first and second areas shall apply similarly to an image pickup apparatus due to a multi-phase driving method instead of limiting to the single-phase driving method.

Figure 6:
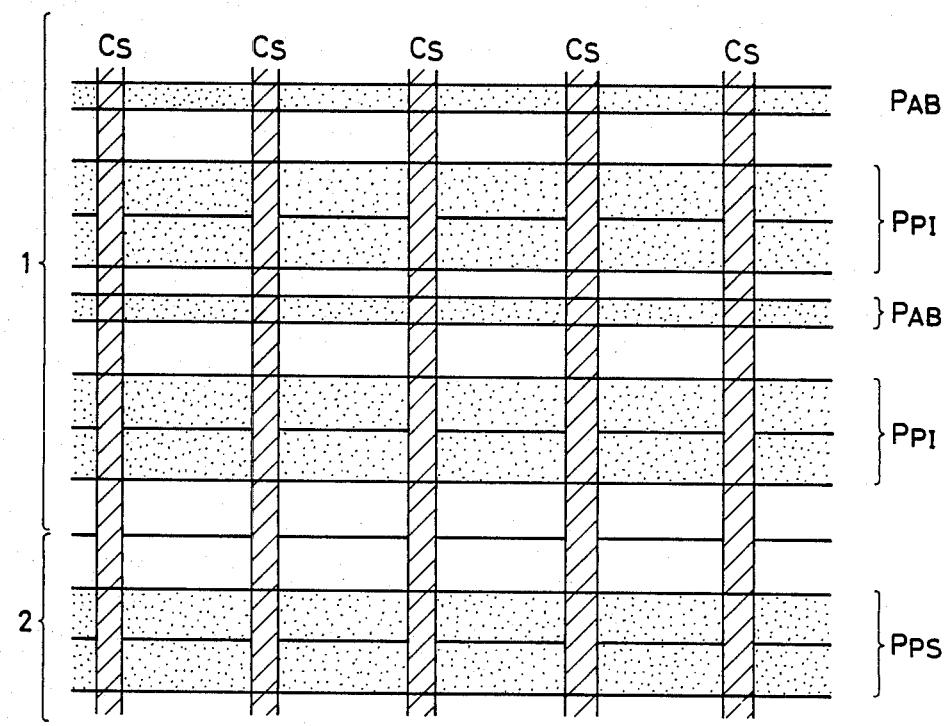
FIG. 6 is a diagram showing an example of an electrode pattern of the sensor shown in FIG. 5.

FIG. 6 is a diagram showing an example of an electrode pattern in the areas shown in FIG. 5. Channel stops CS obstruct the horizontal movement of the charges.

According to the embodiment shown in FIGS. 4 to 6, a width of the electrode $P_{AB}$ for the charge recombination can be made sufficiently smaller than a width of the transfer electrode $P_{PI}$, so that a high removing efficiency can be derived in the removal of the excessive charges.

On one hand, in the CCD image sensor of the single-phase driving method, the operation to recombine the charges can be performed independently of the transfer operation.

Further, a structure for control of the recombination of the image sensor in the embodiment can be formed due to a step of forming polysilicon gates for the electrodes which can be manufactured by the same process as in the case of the channel stop and due to an ion implantation step to form the stairs of the internal potentials.

Figure 7:
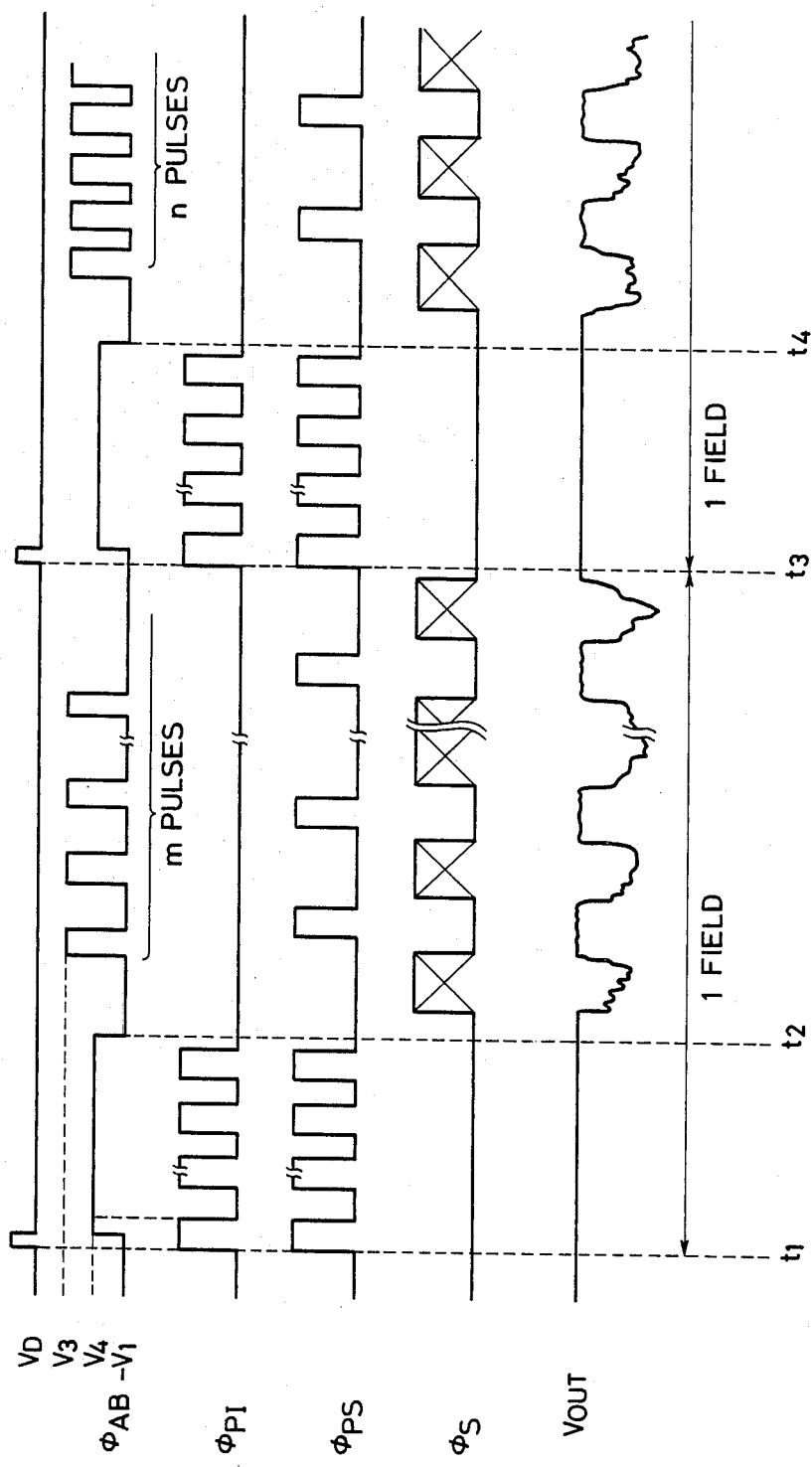
FIG. 7 is a timing chart for explaining the first embodiment of the method of driving the image pickup apparatus of the invention.

FIG. 7 is a waveform diagram showing the clock pulses $\phi_{AB}$, $\phi_{PI}$, $\phi_{PS}$, and $\phi_S$ which are generated from the clock driver CKD to drive the image sensor shown in FIG. 4 and of an output $V_{OUT}$ of the amplifier 4.

In the diagram, a vertical sync signal $V_D$ is obtained at every television field. The clocks $\phi_{PI}$ and $\phi_{PS}$ as many as the number of pixels in the vertical direction of the light receiving part 1 and storage part 2 are supplied synchronously with the $V_D$ for the intervals of $t_1$ to $t_2$ and $t_3$ to $t_4$ such that, for example, these clocks are in-phase.

Due to this, the charges in each pixel cell in the light receiving part 1 are transferred and stored into the corresponding storage cell in the storage part.

Figure 8:
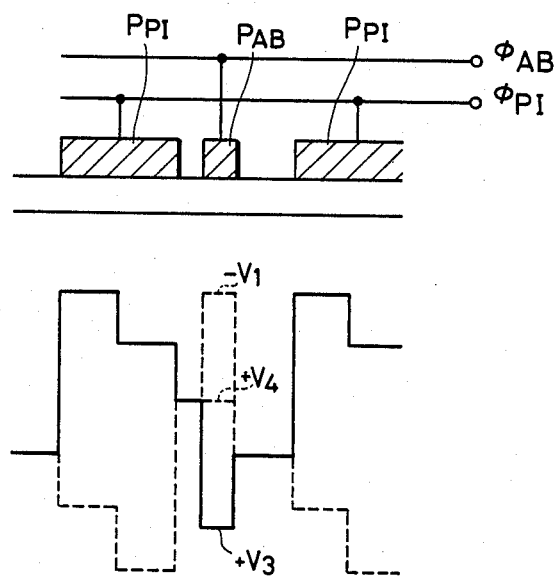
FIG. 8 is a diagram for explaining the potential state of the sensor shown in FIG. 5.

At this time, in the present invention, the clock $\phi_{AB}$ which is applied to the electrode $P_{AB}$ is fixed at a voltage level $V_4$ to prevent the potential below the recombination electrode $P_{AB}$ from obstructing the transfer of the charges. For instance, as shown in FIG. 8, this voltage $V_4$ is the voltage value such that the potential level below the electrode $P_{AB}$ lies between the upper and lower limits of the potential level in the virtual electrode section. More particularly, the voltage $V_4$ is set at a level between the upper and lower limits of the potential in the area excluding the portion below the electrode $P_{AB}$ in the second area Y.

The time interval of $t_1$ to $t_2$ corresponds to the vertical blanking interval of the standard television signal.

A plurality of clocks $\phi_{AB}$ are supplied for the interval of $t_2$ to $t_3$ at an arbitrary timing. The clocks $\phi_{AB}$ may be periodically and continuously supplied or may be supplied only for the horizontal blanking interval.

With an increase in number of clocks $\phi_{AB}$ which are supplied, the removing capability of the excessive charges is raised.

The charges in the storage part are read out one line by one synchronosly with the horizontal period by the clocks $\phi_{PS}$ and $\phi_S$ for the interval of $t_2$ to $t_3$ and are outputted as the horizontal line signals. This interval of $t_2$ to $t_3$ corresponds to the vertical scan interval of the standard television signal.

Next, the second embodiment of the driving method in the case where a video camera is constructed using such an image sensor provided with means for preventing the diffusion of the excessive charges as mentioned above will be described.

Figure 9:
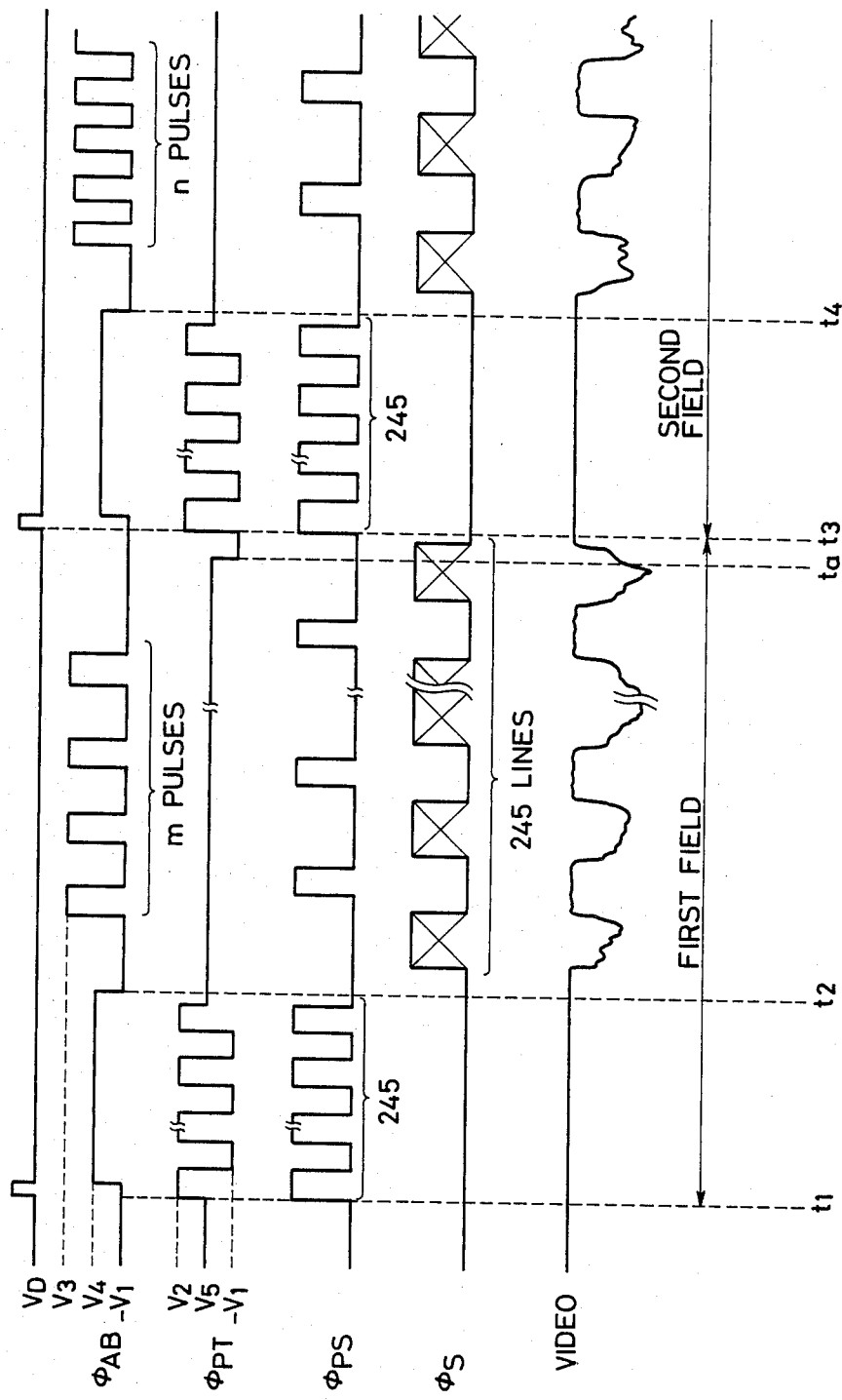
FIG. 9 is a timing chart for explaining the second embodiment of the method of driving the image pickup apparatus of the invention.

FIG. 9 is a timing chart showing output pulses from the clock driver CKD in the foregoing second embodiment.

As shown in the diagram, different points between this embodiment and the embodiments shown in FIG. 7 are as follows. Namely, a level of the $\phi_{PI}$ is fixed at a level $V_5$ which is nearly an intermediate level between $-V_1$ and $V_2$ during the storage intervals until $t_1$, between $t_2$ to $t_a$, and after $t_4$. The rising and trailing of the $\phi_{PI}$ are switched at every field at the end of the storage intervals.

Figure 10:
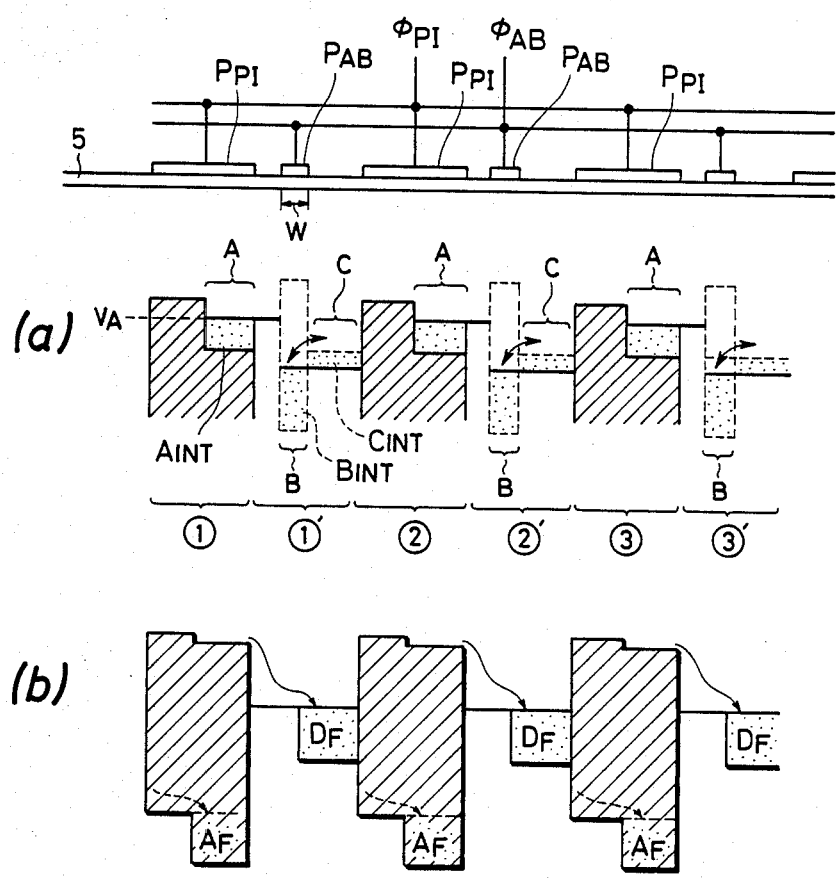
FIGS. 10(a) and 10(b) are diagrams for explaining the potential state in the second embodiment of the invention.

These points will now be explained. By setting the $\phi_{PI}$ at the $V_5$ level during the storage intervals, as shown in FIG. 10(a), potential wells A and C are respectively formed in the substrate below the transfer electrode $P_{PI}$ and in the substrate below the virtual electrode and the charges are stored in the respective wells.

A plurality of pulses $\phi_{AB}$ are supplied during those intervals as shown in FIG. 9, so that the potential below the electrode $P_{AB}$ increases and decreases as shown in FIG. 10(a). However, the excessive charges collected near the insulation layer 5 among the charges in the well B which are produced when this potential decreases are recombined with the holes when the potential increases, so that these excessive charges are extinguished and do not leak into the well A.

It is now assumed that amounts of charges which enter the wells A and C (or B) during the storage interval in the first field until time $t_1$ in FIG. 9 are $A_{INT}$ and $C_{INT}$ (or $B_{INT}$), respectively, as shown in FIG. 10(a). Next, upon vertical transfer which starts from time $t_1$ in FIG. 9, as shown in FIG. 10(b), by increasing the $\phi_{PI}$ from the intermediate level $V_5$ to the $V_2$ level at the start of transfer, the charges stored in the portions ①' and ②, ②' and ③, . . . are added and are transferred to the storage part. On the other hand, in the second field, by decreasing the $\phi_{PI}$ from the intermediate level $V_5$ to the $-V_1$ level at the start (time $t_a$) of transfer, the charges stored in the portions of ① and ①', ② and ②', ③ and ③', . . . are added. In this way, the interlacing operation can be executed by changing the combination of the charges that are added at every field.

With such an arrangement, the interlacing effect can be obtained by use of few pixels, and at the same time the dark current level does not change at every field and the flicker is difficult to occur.

In addition, this embodiment has a feature such that the relation of $A_{INT} < D_{INT}$ is satisfied in the case where a saturation charge amount of the well A is $A_F$, a saturation charge amount in the portions consisting of the wells B and C other than the well A is $D_F$ and an amount of residual charges which are not recombined in the wells of the portions other than the well A is $D_{INT}$.

This point will now be explained hereinbelow.

In this embodiment, unless the following relation is satisfied, the total amount of $A_{INT} + D_{INT}$ will have exceeded the amount of charges that can be transferred; consequently, there will have been some amount of charges left without being transferred.

$$A_{INT} + D_{INT} \leq \min[A_F, D_F] = Q_{SAT}$$

Namely, $(A_{INT} + D_{INT})$ has to be less than the smaller value between the saturation charge amounts $A_F$ and $D_F$.

Therefore, in case of this embodiment, $A_{INT} + D_{INT}$ is set to, for example, the minimum value of the $A_F$ and $D_F$, i.e., about 70% of the $Q_{SAT}$. When it is assumed that this value is the maximum storage charge amount $Q_{max}$ and an amount of light necessary to obtain the charges of $Q_{max}$ is $L_{max}$, the amounts $A_{INT}$ and $D_{INT}$ may be set to be equal, i.e., $A_{INT} = D_{INT}$ in order to allow the interlacing operation to be performed until the light amount reaches from 0 to $L_{max}$.

However, although the interlacing operation can be performed due to the above method, a satisfactory function to remove the excessive charges is not derived.

That is, in order to secure the elements as many as required in the screen size of, e.g., ⅔ inches, it is actually necessary to set a width W of the electrode $P_{AB}$ to a value near the minimum line width, i.e., to a value of 3 to 4 μm.

A method whereby the number of locations for the recombination is increased is considered to raise the recombining capability of the sensor under such situation; however, in this case, a drawback of deterioration in yield is caused.

On the other hand, a method whereby an area of the electrode $P_{AB}$ for recombination is enlarged is also considered.

Figure 11:
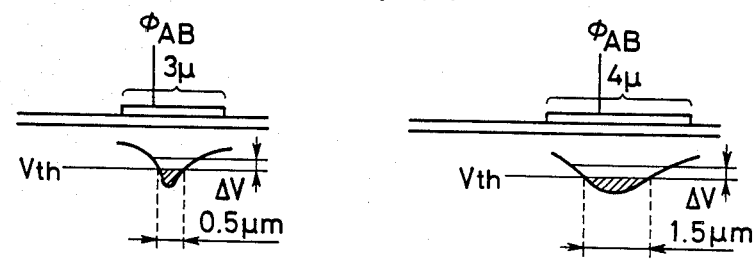
FIG. 11 is a diagram for explaining a narrow channel effect.

Practically speaking, as shown in FIG. 11, in the case where the width W of electrode is set to 3 μm due to the narrow channel effect, the effective width of the well which is formed below the electrode and which contributes to the recombination is about 0.5 μm. On the other hand, when the width W of electrode is set to 4 μm, the effective width of the well which contributes to the recombination is about 1.5 μm. Therefore, if a sufficient amount of charges which can be collected in this well exist, the amount of charges which can be erased at every clock $\phi_{AB}$ is improved to about three times. However, in this case, if the amount of charges which can be collected into the well B below the electrode $P_{AB}$ is not so large, the recombining capability is not derived as described before.

On one hand, the value $Q_{max}$ becomes a certain constant if the number of pixels and area of the CCD are determined. Therefore, it is necessary to reduce the amount $A_{INT}$ by an amount of increase in $D_{INT}$.

Therefore, in this embodiment, a control is made by the clock driver in a manner such that there is the relation of $$0 < A_{INT} < D_{INT}$$

between an amount of charges $A_{INT}$ in the well below the electrode $P_{PI}$ as the first area and an amount of residual charges $D_{INT}$ which are not recombined in the wells below the virtual electrode and recombination electrode as the second area. Thus, the interlacing effect is obtained and the high recombining capability can be also derived.

In this case, for instance, if the width W of $P_{AB}$ is 4 μm and the $D_{INT}$ is set to be 50% of the $Q_{SAT}$ and the $A_{INT}$ is set to be about 20% of the $Q_{SAT}$, the interlacing capability will be up to about 57% of the $L_{max}$. Namely, the interlacing effect is not obtained for the light amount exceeding the above value of 57%, but the anti-blooming capability is improved to about three times the conventional capability. The video camera in this embodiment is provided with suppressing means for setting the interlacing capability to be less than 20% of the $L_{max}$ with regard to most of the picture plane and for suppressing the signal component corresponding to the light amount exceeding this value due to compression or the like as shown in FIG. 4; therefore, the deterioration in interlacing capability in case of high luminance is inconspicuous.

Figure 12:
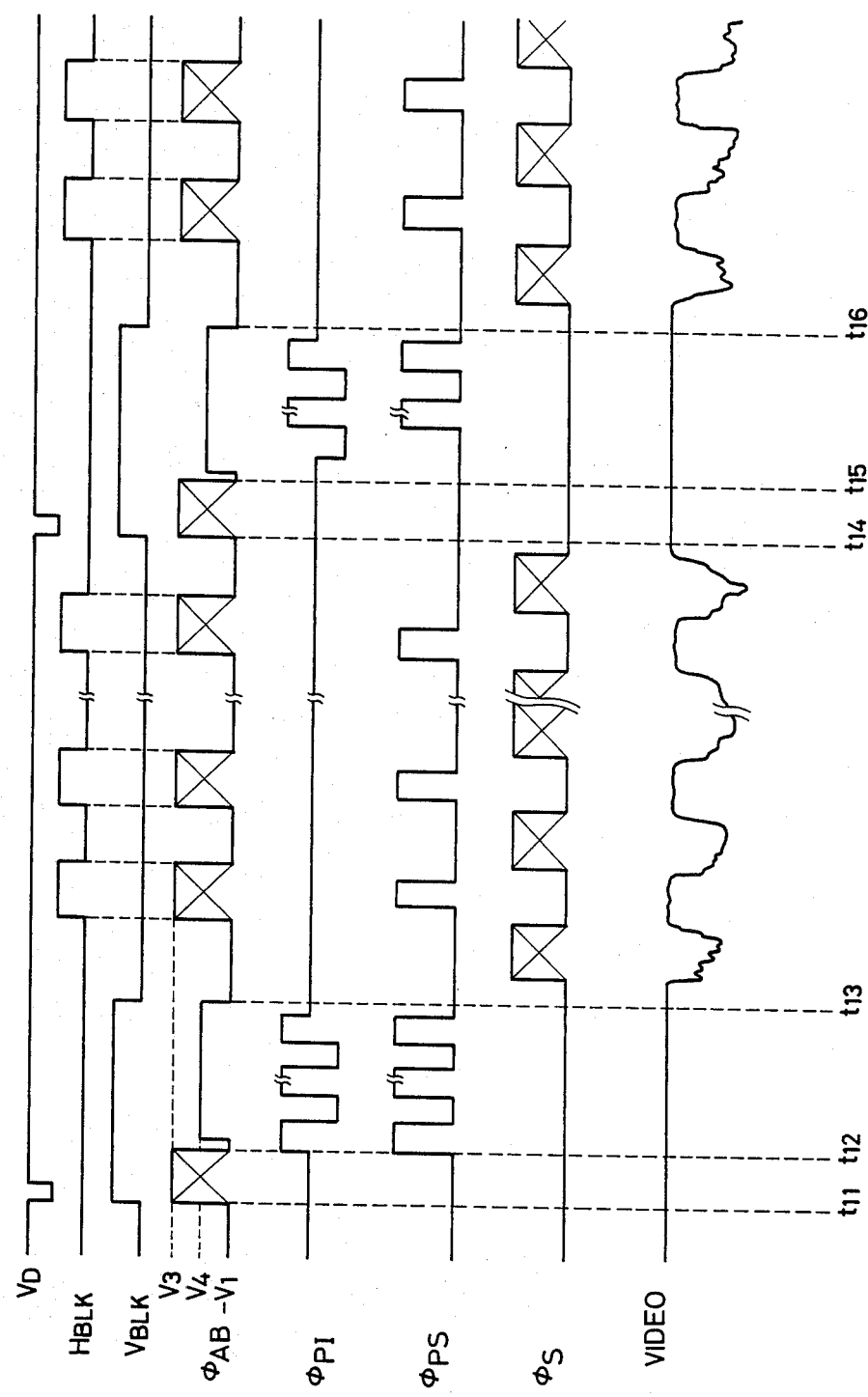
FIG. 12 is a timing chart for the driving of the image pickup apparatus of the third embodiment of the invention.

FIG. 12 is a diagram showing the drive timings in the third embodiment of the present invention. This embodiment comprises: the light receiving part for converting an optical image to a charge signal; recombining means for allowing a part of charges in the light receiving part to be recombined with the majority carrier; and control means for forming a signal to allow the charge signal in the light receiving part to be transferred and for allowing the recombining means to perform the recombining operation for a predetermined time immediately before the transfer of the charge signal. Therefore, it is possible to reduce the excessive charges stored until the start of frame transfer to a proper value by supplying a pulse for charge recombination immediately before the frame transfer, thereby making it possible to prevent the blooming or smear which is caused since those excessive charges cannot be transferred upon frame transfer.

FIG. 12 shows a waveform diagram of the clock pulses and the like which are generated from the clock driver CKD to drive the image sensor shown in FIG. 4, in which a vertical blanking signal $V_{BLK}$ is outputted for the intervals of $t_{11}$ to $t_{13}$ and $t_{14}$ to $t_{16}$ synchronously with the vertical sync signal $V_D$ which is obtained at every television field.

$H_{BLK}$ denotes a horizontal blanking signal.

That is, $t_{11}$ to $t_{13}$ corresponds to $t_1$ to $t_2$ in FIGS. 7 and 9; $t_{13}$ to $t_{14}$ corresponds to $t_2$ to $t_3$; and $t_{14}$ to $t_{16}$ corresponds to $t_3$ to $t_4$. By supplying a plurality of pulses $\phi_{AB}$ for the intervals of $t_{11}$ to $t_{12}$ and $t_{14}$ to $t_{15}$, the excessive charges immediately before the vertical transfer are removed. Further, the clocks $\phi_{PI}$ and $\phi_{PS}$ as many as the number of pixels in the vertical direction of the light receiving part 1 and storage part 2 are supplied for the intervals to $t_{12}$ to $t_{13}$ and $t_{15}$ to $t_{16}$ such that they are substantially in-phase, thereby allowing the charges in each pixel cell in the light receiving part 1 to be transferred and stored in the corresponding storage cell in the storage part. These points are similar to those in the embodiment shown in FIGS. 7 and 9.

Figure 13:
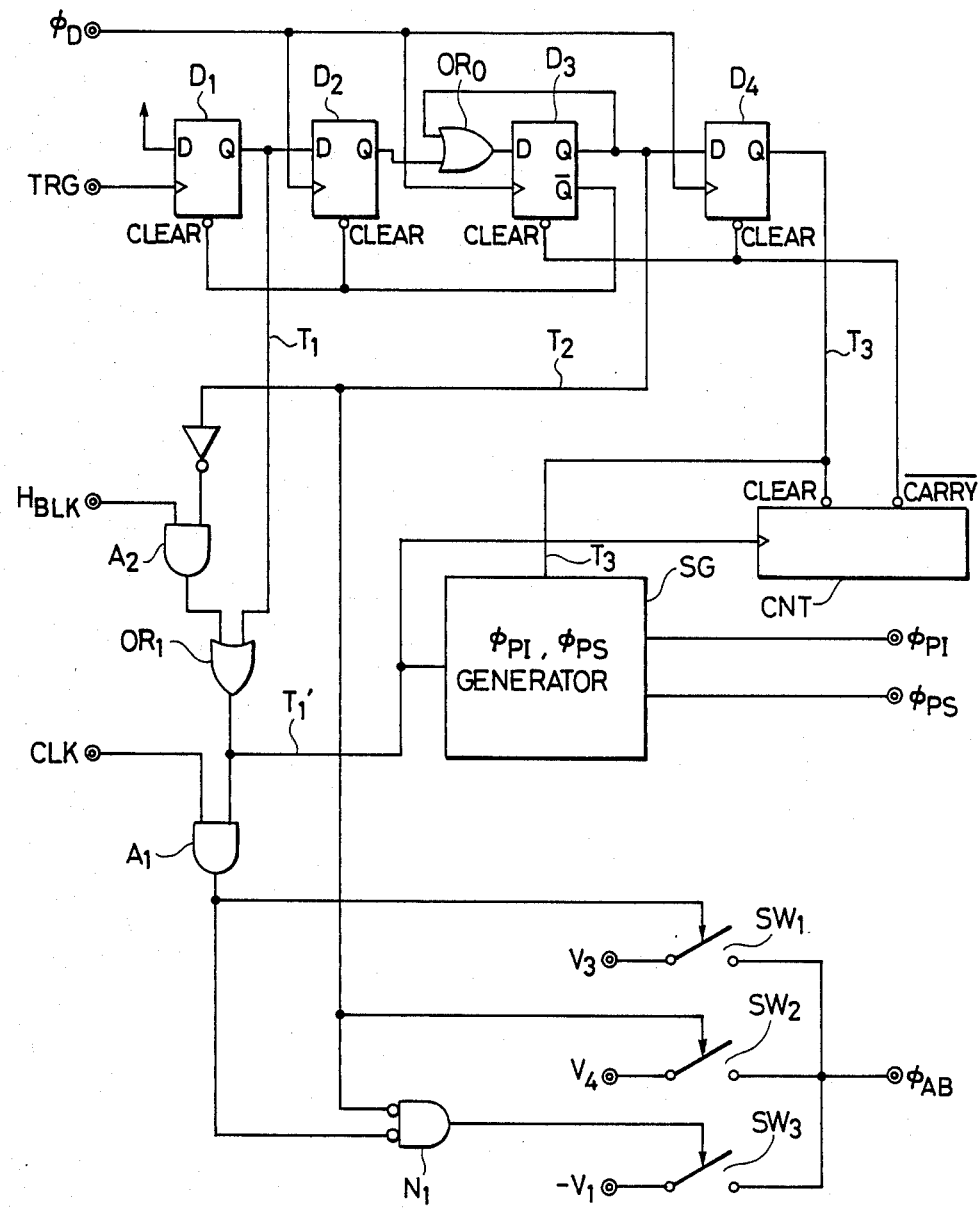
FIG. 13 is a diagram showing an example of an arrangement of a clock driver.
Figure 14:
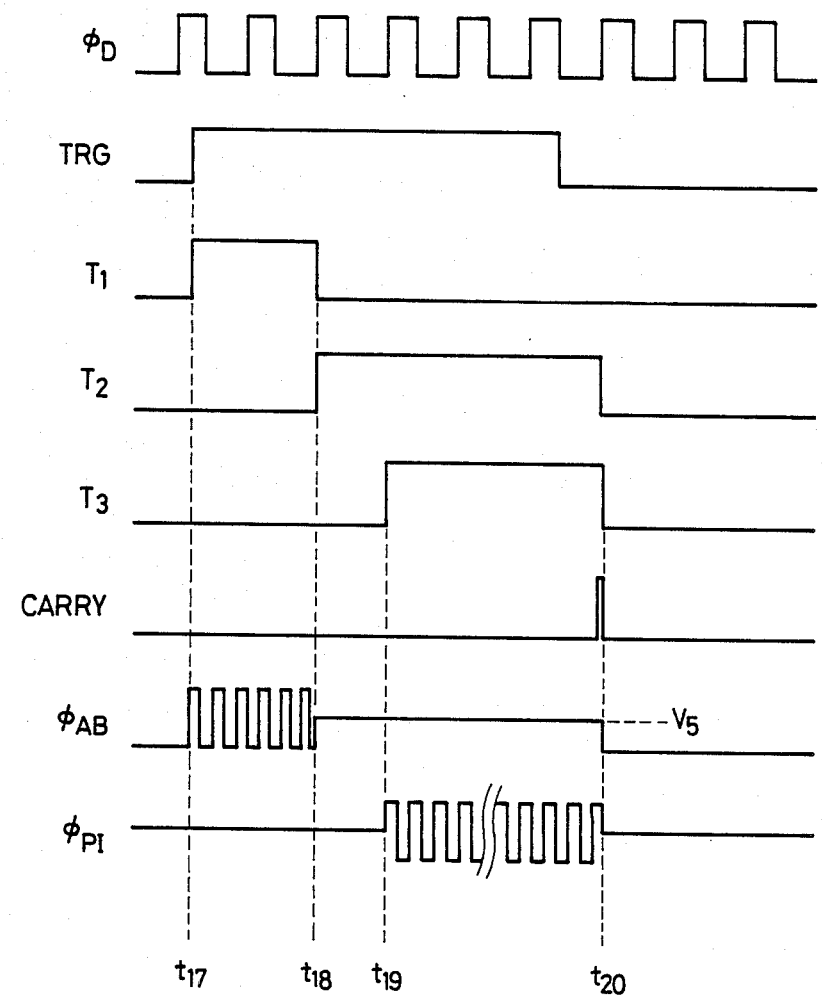
FIG. 14 is a timing chart for the operation of the clock driver of FIG. 13.

Next, FIG. 13 is a diagram showing an example of an arrangement of the clock drive CKD. FIG. 14 shows a timing chart for the operation of the clock driver CKD. In FIGS. 13 and 14, $\phi_D$ denotes a pulse which is generated twice for one horizontal interval, and TRG is a frame transfer trigger pulse for allowing the frame transfer to be executed. This pulse TRG is generated for the vertical blanking interval or at a timing relative thereto.

The pulse TRG may be outputted at arbitrary timing other than the vertical blanking interval as disclosed in, e.g., Japanese Patent Application No. 61098/1983. In such a case, the image storing time can be also controlled by the timing of this pulse TRG.

A D flip flop $D_1$ receives the pulse TRG as the clock and its input D is always at a high level, so that an output $T_1$ becomes a high level due to the trigger (at time $t_{17}$) in response to the TRG. Therefore, an output $T_2$ is generated (at time $t_{18}$) after the delay time of only two clocks $\phi_D$ due to D flip flops $D_2$ and $D_3$, so that this causes the flip flop $D_1$ to be cleared and the output $T_1$ becomes a low level. The length of this interval can be reduced or increased by increasing or decreasing the number of D flip flops. In this embodiment, this interval of $t_{17}$ to $t_{18}$ is set to one horizontal interval; however, it becomes H/2 interval by omitting the $D_2$. After the output $T_2$ became a high level, an output $T_3$ of the D flip flop $D_4$ becomes a high level at time $t_{19}$ and after predetermined clocks, the flip flops $D_3$ and $D_4$ are cleared (at time $t_{20}$) in response to an output CARRY of a counter CNT. Thus, the outputs $T_2$ and $T_3$ become a low level and the frame transfer is finished.

The clocks $\phi_{PI}$, $\phi_{PS}$ and the like can be generated from a pulse generator SG as shown in FIG. 12; therefore, they are not shown here in particular.

The horizontal blanking signal $H_{BLK}$ is set at a low level by an AND gate $A_2$ while the output $T_2$ is at a high level. An output of the AND gate $A_2$ is supplied to an OR gate $OR_1$ and an output $T_1'$ is generated from the OR gate $OR_1$ due to the OR of the output $T_1$ and output of the AND gate $A_2$. Thus, the output $T_1'$ becomes the timing signal to make the $\phi_{AB}$ operative. Namely, the output $T_1'$ becomes a high level either for the horizontal blanking interval excluding the vertical transfer interval of $t_{18}$ to $t_{20}$ or for the interval of $t_{17}$ to $t_{18}$ when the output $T_1$ is at a high level corresponding to the portion immediately before the output $T_2$.

A clock signal CLK is logically multiplied with the output $T_1'$ by an AND gate $A_1$ to get AND, thereby turning on a switch $SW_1$ to set the $\phi_{AB}$ at the voltage level $V_3$ for only the interval when both clock CLK and output $T_1'$ are at a high level. While the $T_2$ is at a high level, a switch $SW_2$ is turned on, thereby setting the $\phi_{AB}$ at the intermediate voltage level $V_4$. In other cases, a switch $SW_3$ is closed due to an output of an NOR gate $N_1$, so that the $\phi_{AB}$ is set at the voltage level $-V_1$.

As described above, according to the third embodiment of the present invention, the excessive charges stored until the start of frame transfer are reduced to a proper value by supplying the pulse for recombination of the charges immediately before the frame transfer, thereby making it possible to prevent the blooming or smear that is caused since all of the excessive charges cannot be transferred upon frame transfer.

On one hand, a large electric power consumption in case of the operation for the vertical blanking interval is not caused; therefore, the invention is also effective even in the case where the frame transfer is performed in other intervals than the vertical blanking interval for an exceptional use such as to obtain a storage time shorter than the field period.

Figure 15:
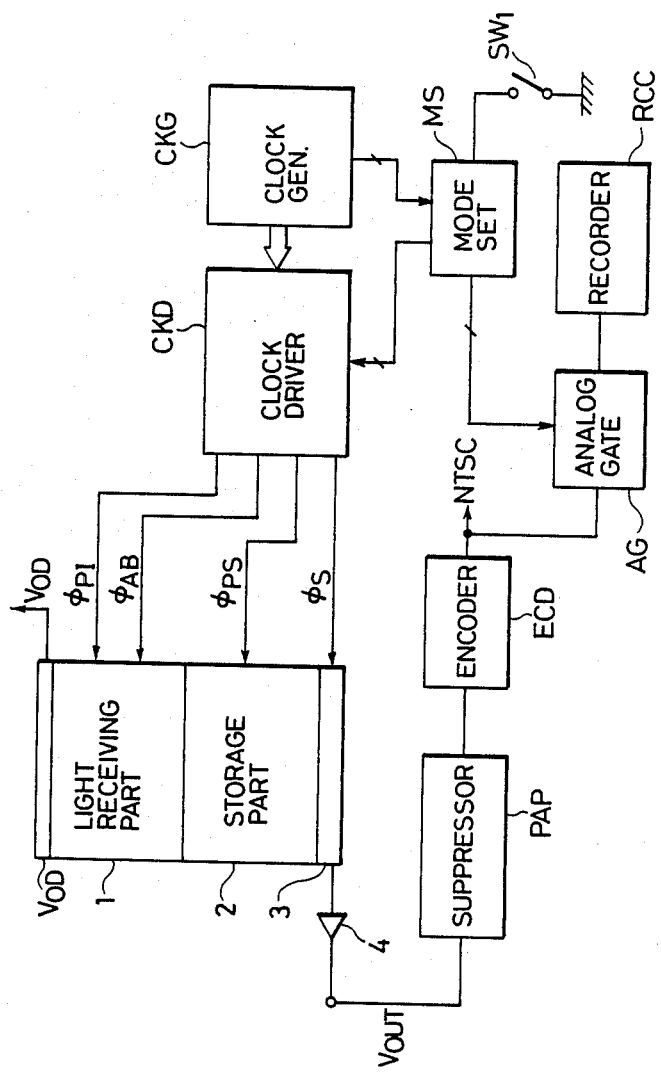
FIG. 15 is a diagram showing an example of an arrangement of the fourth embodiment of the invention.

Next, FIG. 15 is a diagram showing the fourth embodiment of the present invention, in which the similar parts and components as those shown in FIGS. 1 to 14 are designated by the same reference numerals.

OFD denotes an overflow drain to dran the excessive charges. This overflow drain OFD is arranged on the side of the light receiving part 1 opposite to the storage part 2 and is biased by a constant positive voltage $V_{OD}$.

MS indicates a mode setting circuit to switch the output states of the various kinds of pulses that are generated from the clock driver CKD and can change over the frequency of the clock $\phi_{AB}$ for recombination. The mode setting circuit MS also controls the turn-on and turn-off of an analog gate AG.

RCC is a recorder. $SW_1$ is the switch for allowing the still signal to be recorded. When this switch is turned on, the mode setting circuit is automatically set into the still mode as will be explained later and the driver CKD is controlled, and at the same time the gate AG is opened at a predetermined timing for one field or one frame interval.

Figure 16:
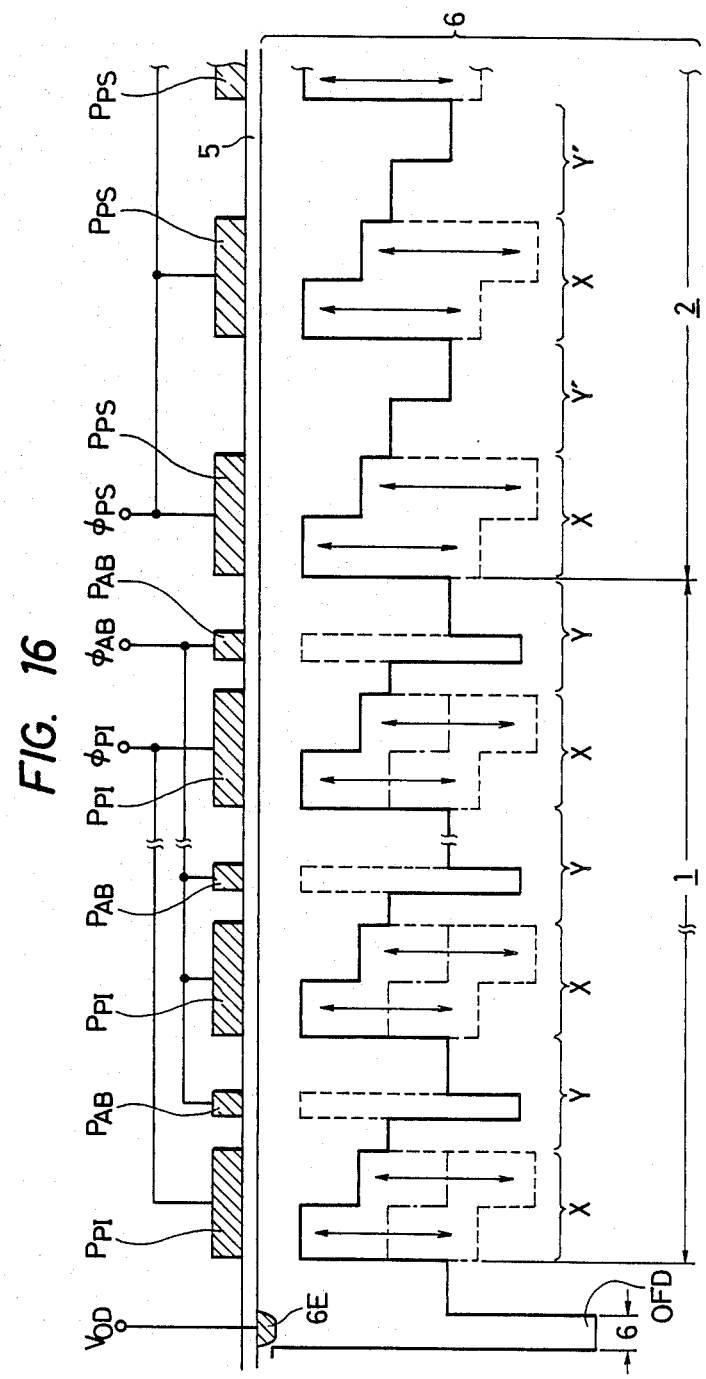
FIG. 16 is a cross sectional schematic diagram showing an example of a structure of an image sensor which is fitted for use in the fourth embodiment of the invention.

FIG. 16 is a diagram showing schematically structures of electrodes and potentials in the cross section in the boundary region of the light receiving part 1 and storage part 2 in the fourth embodiment.

A numeral 6E denotes an n+ area constituting the overflow drain.

When the switch $SW_1$ is OFF, namely, in the movie photograph mode, the clock pulses as shown in FIG. 12 are generated from the clock driver CKD to drive the image sensor shown in FIG. 15 and the output $V_{OUT}$ of the amplifier 4 and the like are generated.

Figure 17:
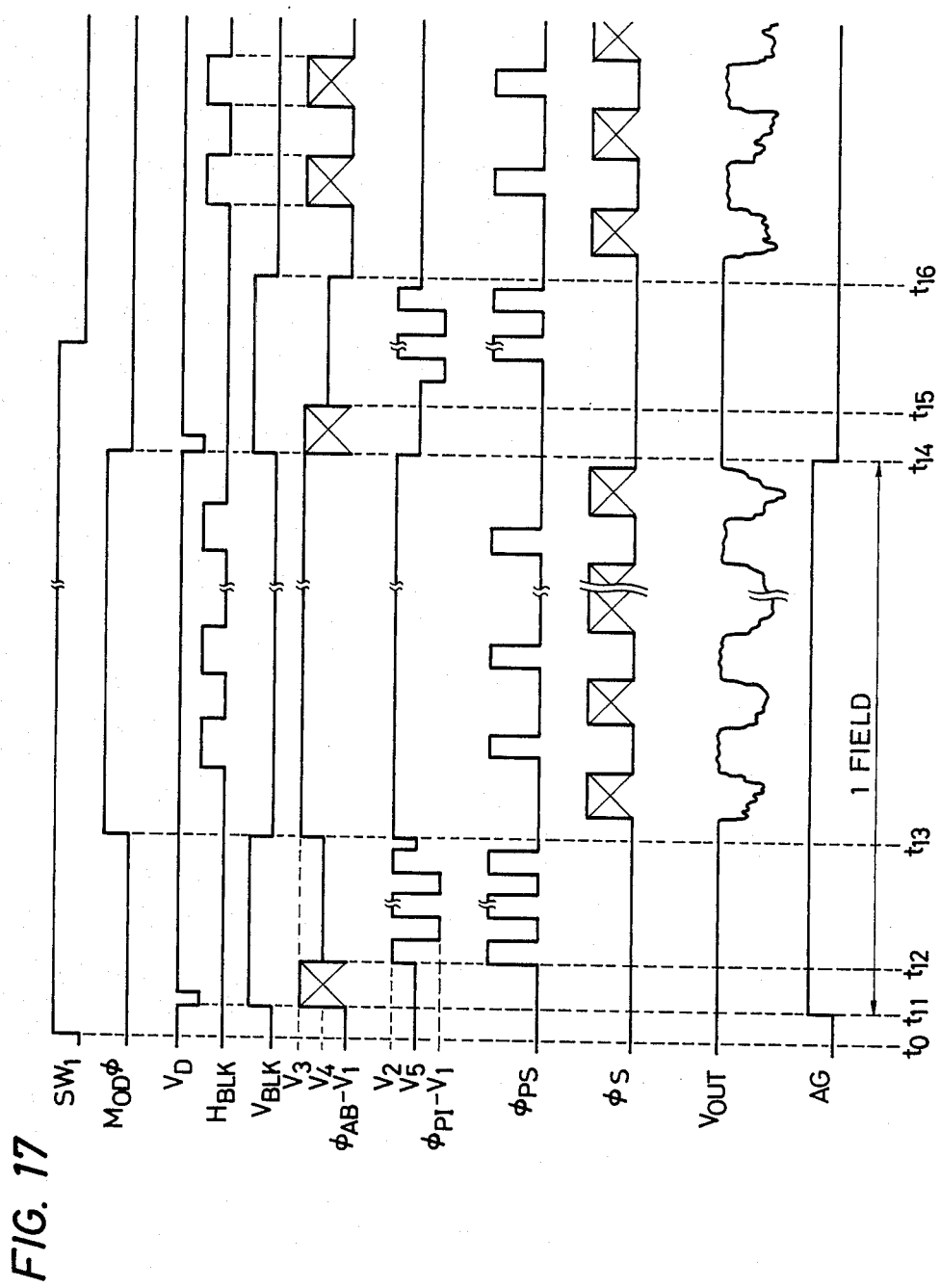
FIG. 17 is a timing chart illustrating operation in the still mode.

Next, FIG. 17 shows a timing chart in the case where the switch $SW_1$ is turned ont to perform the photographing operation in the still mode. When the switch $SW_1$ is turned on at arbitrary time $t_0$, a signal MODE$\phi$ for the still mode which will be explained later is generated from the mode setting circuit MS synchronously with the trailing edge (at time $t_3$) of the next vertical blanking pulse $V_{BLK}$.

This signal MODE$\phi$ is held until time $t_{14}$ of the leading edge of the next vertical blanking pulse $V_{BLK}$.

On one hand, the pulse $\phi_{AB}$ is fixed to the potential $V_3$ and the pulse $\phi_{PI}$ is fixed to the potential $V_2$ for the interval when the signal MODE$\phi$ is being outputted. The analog gate AG is turned on for one field interval ($t_{11}$ to $t_{14}$) synchronously with the vertical sync signal $V_D$ immediately after the switch $SW_1$ was turned on.

With respect to the other pulses, they are similar to the case in FIG. 12.

Therefore, during the interval when the signal in one field is read out in response to the pulses $\phi_{PS}$ and $\phi_S$ synchronously with the vertical sync signal $V_D$ after the switch $SW_1$ was turned on, the analog gate AG leads this signal to the recorder RCC, so that the signal in one field is recorded.

Particularly, the pulse $\phi_{AB}$ is at a constant level for the interval of $t_{13}$ to $t_{14}$ during that interval; therefore, no noise is mixed while the signal $V_{OUT}$ is being read out and an electric power consumption can be also saved.

On the other hand, the potential barrier in the light receiving part 1 is lower than the barrier in the storage part 2 for almost of the interval ($t_{13}$ to $t_{14}$). Namely, in FIG. 16, the potential in the area X is as indicated by a broken line and the potential in the area Y is as shown by a solid line, so that even if the pulse $\phi_{AB}$ is in the inoprative state, the overflowed charges do not substantially leak into the storage part.

Moreover, since the overflow drain is provided on the side of the light receiving part 1 opposite to the storage part 2, the overflowed charges in the light receiving part 1 at this time will have been drained to the power supply VOD.

Although the potential in the area X in the storage part decreases for only the horizontal blanking interval in response to the pulse $\phi_{PS}$, the effective image signal (image signal formed until time $t_{11}$) is moved in the storage part 2 downwardly in FIG. 15 whenever it decreases. Thus, it is possible to ignore the charges which leak from the light receiving parts 1 into the storage part 2 while the pulse $\phi_{PS}$ is at a high level.

Figure 18:
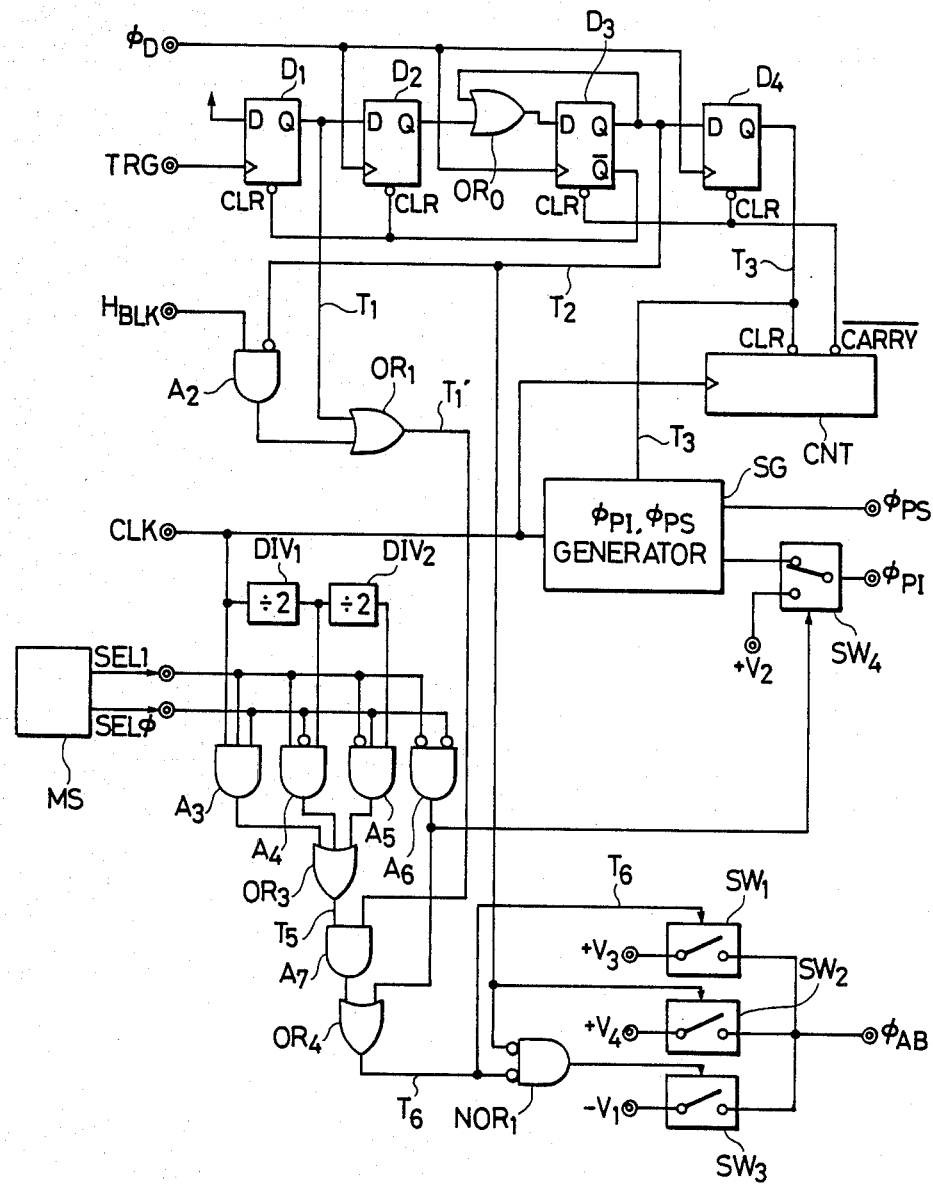
FIG. 18 is a diagram showing an example of an arrangement of the clock driver.

FIG. 18 shows an example of an arrangement of the clock driver CKD, in which the similar parts and components as those shown in FIG. 13 are designated by the same reference numerals.

In the diagram, $D_1$ to $D_4$ denote D flip flops; $OR_1$ to $OR_4$ are OR gates; CNT the counter; SG the pulse generator to produce the pulses $\phi_{PI}$ and $\phi_{PS}$; $SW_1$ to $SW_4$ analog switches; $DIV_1$ and $DIV_2$ ½-frequency dividers; $A_2$ to $A_7$ AND gates; and $NOR_1$ an NOR gate.

The clock signal CLK, frequency divided signals of the frequency dividers $DIV_1$ and $DIV_2$, and outputs of the mode setting circuit MS are supplied to the AND gates $A_3$ to $A_6$ and the following relations are satisfied.

Namely, when the outputs $SEL_1$ and $SEL\phi$ of the mode setting circuits MS equal H (hereinafter, called MODE3), the clock CLK is outputted as it is an an output $T_5$ of the OR gate $OR_3$. When $SEL_1=H$ and $SEL\phi=L$ (hereinbefore, called MODE2), the output $T_5$ becomes the ½-frequency divided ouput of the clock CLK.

On the other hand, when $SEL_1=L$ and $SEL\phi=H$ (hereinafter, called MODE1), the output $T_5$ becomes the ¼-frequency divided output of the clock CLK. When the $SEL_1=L$ and $SEL\phi=L$ (hereinbelow, called MODE$\phi$), the output $T_5$ always becomes an H level.

$T_1$ denotes the timing pulse to supply the pulse $\phi_{AB}$ immediately before the vertical transfer. The pulse $\phi_{AB}$ is supplied when the pulse $T_1$ is at a high level.

$T_3$ is the timing pulse for the vertical transfer. When this pulse $T_3$ is at a high level, the vertical transfer is performed in response to the pulses $\phi_{PI}$ and $\phi_{PS}$.

While the switch $SW_1$ shown in FIG. 15 is in the OFF state, the period of the pulse $\phi_{AB}$ is determined in accordance with the modes MODE1 to MODE3 selected by the mode setting circuit and the pulse $\phi_{AB}$ is supplied at timings as shown in FIG. 12.

The pulses $\phi_{PI}$ and $\phi_{PS}$ are generated from the pulse generator SG at timings as shown in FIG. 12.

When the switch $SW_1$ is once turned on, the mode setting circuit MS enters the MODE$\phi$ immediately after that, so that the $SEL_1-L$ and $SEL\phi=L$ and an output $T_6$ of the OR gate $OR_4$ in FIG. 18 becomes a high level and the pulse $\phi_{AB}$ is set to the potential $V_3$. On one hand, the analog switch $SW_2$ is switched to the side of b during this interval, so that the pulse $\phi_{PI}$ is fixed to the potential $+V_2$.

As described above, according to this embodiment, the pulse $\phi_{AB}$ is supplied for a predetermined time immediately before the frame transfer interval and the excessive charges immediately before the transfer are removed, so that the smear or blooming is not caused.

In addition, the pulse $\phi_{AB}$ is fixed to a constant potential in case of recording the video output from the image sensor by only one field or one frame, so that an electric power consumption can be saved and no noise is mixed.

On the other hand, the potential barrier in the light receiving part is set to be lower than the potential barrier in the storage part for almost of the time intervals; therefore, the readout signal from the storage part is not influenced by the blooming during the readout operation of the signal.

Further, since the overflow drain is provided on the side of the light receiving part opposite to the storage part, the overflow changes during this interval can be soon removed.

Although an example of the frame transfer type CCD of the single-phase driving method has been described in the above, it will be appreciated that the present invention can be also similarly applied to a CCD image sensor of the multi-phase driving method. It is also obvious that the invention can be applied to not only the CCD image sensor but also all image sensors of the types which convert an image singal to a charge signal and store it.

In the embodiment, the $\phi_{PI}=V_2$ and $\phi_{AB}=V_3$ in the MODE$\phi$; however, even if the $\phi_{PI}=V_5$ and $\phi_{AB}=V_4$, a similar effect will be derived since the potential barrier in the light receiving part is lower than the barrier in the storage part. In addition, in the embodiment, the potential level of the $\phi_{PI}$ as well as the $\phi_{AB}$ can be also controlled by the signals SEL$_1$ and SEL$_1$ and SEL$\phi$ from the mode setting circuit, so that the number of input pins of the clock driver can be reduced.

According to the fourth embodiment of the invention, the pulses $\phi_{AB}$ and $\phi_{PI}$ are set to the constant potentials in case of recording in the still mode, so that the electric power consumption can be saved and no noise is mixed.

Further, at this time, these potentials are set to be lower than the potential in the storage part with regard to the electrons, so that even if the blooming occurs in the light receiving part, it is not mixed to the storage part.

What is claimed is:

1. An image pickup apparatus comprising:
   first and second areas for converting an incident light to charges;
   recombining means for allowing a part of said charges in said second area to be recombined with majority carrier; and
   control means for allowing the charges to be stored respectively in said first and second areas and also making said recombining means operative, and for controlling said first and second areas and said recombing means in a manner such that there is a relation of $A_{INT}<D_{INT}$ between an amount $A_{INT}$ of charges stored in the first area and an amount $D_{INT}$ of residual charges which are not recombined in the second area.

2. An image pickup apparatus according to claim 1, wherein said recombining means includes an electrode to control a potential in said second area.

3. An image pickup apparatus according to claim 1, wherein $A_{INT}<0$.

4. An image pickup apparatus according to claim 1, further including an electrode to control a potential level in said first area.

5. An image pickup apparatus according to claim 1, wherein said second area includes a virtual electrode area.

6. An image pickup apparatus according to claim 1, wherein said first and second areas have charge transfer structures.

7. An image pickup apparatus according to claim 1, wherein said control means controls said first and second areas to provide output signal by adding charge accumulated in said first area and charge left unrecombined in said second area, and then to transfer the added charge to be read out; and
   said image pickup apparatus further including suppressing means for suppressing the output signal.

8. An image pickup apparatus according to claim 7, wherein said suppressing means includes a non-linear circuit.

9. An image pickup apparatus according to claim 1, wherein said recombining means periodically operates while the charges are being stored in the first and second areas.

10. An image pickup apparatus according to claim 9, wherein said recombining means intermittently operates.

11. An image pickup apparatus comprising:
    a light receiving part for converting an optical image to a charge signal, and for accumulating the charge signal;
    recombining means for allowing a part of charges in said light receiving part to be recombined with a majority carrier; and
    control means for producing signals to allow the charge signal in said light receiving part to be accumulated in a first period and transferred and for allowing said recombining means to perform the recombining operation during a predetermined second period shorter than said first period immediately before at least said transfer of the charge signal.

12. An image pickup apparatus according to claim 11, wherein said recombining means includes an electrode to control a potential in said light receiving part.

13. An image pickup apparatus according to claim 11, wherein said control means periodically transfers the charges in said light receiving part.

14. An image pickup apparatus according to claim 13, wherein said control means transfers the charges in said light receiving part within a vertical blanking interval of a television.

15. An image pickup apparatus according to claim 14, wherein said recombing means performs the recombining operation within at least the vertical blanking interval.

16. An image pickup apparatus according to claim 11, wherein said light receiving part includes first and second areas.

17. An image pickup apparatus according to claim 16, wherein said recombining means includes an electrode to control a potential in said second area.

18. An image pickup apparatus according to claim 16, further including an electrode to control a potential level in said first area.

19. An image pickup apparatus according to claim 16, wherein said second area includes a virtual electrode area.

20. An image pickup apparatus according to claim 16, wherein said first and second areas have charge transfer structures.

21. An image pickup apparatus according to claim 16, wherein said control means adds charges in said first and second areas to transfer; and
    said image pickup apparatus further including suppressing means for suppressing a part of the charge signal of the added charge.

22. An image pickup apparatus according to claim 16, wherein said recombining means recombines a part of said charges in said second area with the majority carrier.

23. An image pickup apparatus according to claim 22, wherein said control means controls said first and second areas and said recombining means in a manner such that there is a relation of $A_{INT} < D_{INT}$ betweem am amount $A_{INT}$ of charges stored in said first area and an amount $D_{INT}$ of residual charges which are not recombined in said second area.

24. An image pickup apparatus according to claim 11, further including a storage part for storing the charge signal in said light receiving part.

25. An image pickup apparatus according to claim 24, wherein said control means controls said light receiving part including said recombining means in a manner such that a potential state in said light receiving part becomes a predetermined constant level while the signal in said storage part is read out.

26. An image pickup apparatus comprising:
a light receiving part for converting an optical image to a charge signal;
recombining means for allowing a part of said charges in said light receiving part to be recombined with majority carrier;
a storage part for storing the charge signal in said light receiving part; and
control means for controlling said light receiving part including said recombining means in a manner such that each potential state in the light receiving part becomes a predetermined constant level while the signal in said storage part is read out.

27. An image pickup apparatus according to claim 26, further including recording means for recording the signal which is read out from said storage part.

28. An image pickup apparatus according to claim 27, further including selecting means for selecting a still mode in that the signal of one picture plane is recorded by said recording means and a movie mode in that the signals of a plurality of continuous picture planes are recorded.

29. An image pickup apparatus according to claim 28, wherein said control means controls the potential state in said light receiving part so as to become a predetermined constant level while the signal is read out from the storage part and is recorded in said still mode, and said control means periodically drives said recombining means while the signal is read out from the storage part and is recorded in said movie mode.

30. An image pickup apparatus according to claim 29, wherein said siad control means continuously drives said recombining means while the signal is read out from said storage part and is recorded in the movie mode.

31. An image pickup apparatus according to claim 29, wherein said control means intermittently drives said recombining means while the signal is read out from the storage part and is recorded in the movie mode.

32. An image pickup apparatus according to claim 26, wherein said recombining means includes an electrode to control a potential in said light receiving part.

33. An image pickup apparatus according to claim 26, wherein said light receiving part includes first and second areas.

34. An image pickup apparatus according to claim 33, wherein said recombining means includes an electrode to control a potential in said second area.

35. An image pickup apparatus according to claim 33, further including an electrode to control a potential level in said first area.

36. An image pickup apparatus according to claim 33, wherein said second area includes a virtual electrode area.

37. An image pickup apparatus according to claim 33, wherein said first and second areas have charge transfer structures.

38. An image pickup apparatus according to claim 33, wherein said control means adds charges in said first and second area to introduce the added charges into said storage part; and
said image pickup apparatus further including suppressing means for suppressing a signal read out from said storage part.

39. An image pickup apparatus according to claim 33, wherein said recombining means recombines a part of said charges in said second area with the majority carrier.

40. An image pickup apparatus comprising:
a light receiving part including plurality of picture elements in a semiconductor substrate, each of said elements including first and second areas for respectively converting an optical image into a charge signal;
recombining means for recombining at least a part of charges in said light receiving part with a majority carrier;
control means for producing signals to allow the charge signal in said first and second areas to be accumulated and thereafter added to form an output signal, said control means also producing signals for controlling said recombining means to recombine a portion of the charges in said light receiving part; and
suppression means having a non-linear circuit for suppressing a part of the output signal.

41. An image pickup apparatus according to claim 40, wherein said recombining means includes an electrode to control a potential in said second area.

42. An image pickup apparatus according to claim 40, wherein said second area includes a virtual electrode area.

43. An image pickup apparatus according to claim 40, wherein said first and second areas have charge transfer structures.

44. An image pickup apparatus according to claim 40, wherein said recombining means periodically operates while the charges are being stored in said first and second areas.

45. An image pickup apparatus comprising:
a light receiving part for converting an optical image to a charge signal;
recombining means for allowing a part of said charge in said light receiving part to be recombined with majority carrier;
a storage part for storing the charge signal converted in said light receiving part;
recording means for recording a signal which is read out from said storage part;
selecting means for selecting a still mode in which the signal of one picture plane is recorded by said recording means, and a movie mode in which the signal of a plurality of continuous picture planes are recorded; and
control means for controlling said light receiving part and said recombining means in a manner such that, in said still mode, a potential state in the light receiving part becomes a predetermined constant level while the signal is read out from the storage part and is recorded, and, in said movie mode, said control means periodically drives said recombining means while the signal is read out from the storage part and is recorded.

46. An image pickup apparatus according to claim 45, wherein said control means continuously drives said recombining means while the signal is read out from said storage part and is recorded in the movie mode.

47. An image pickup apparatus according to claim 45, wherein said control means intermittently drives said recombining means while the signal is read out from the storage part and is recorded in the movie mode.

48. An image pickup apparatus according to claim 45, wherein said recombining means includes an electrode to control a potential in said light receiving part.

49. An image pickup apparatus according to claim 45, wherein said light receiving part includes first and second areas.

50. An image pickup apparatus according to claim 49, wherein said recombining means includes an electrode to control a potential in said second area.

51. An image pickup apparatus according to claim 49, further including an electrode to control a potential level in said first area.

52. An image pickup apparatus according to claim 49, wherein said second area includes a virtual electrode area.

53. An image pickup apparatus according to claim 49, wherein said first and second areas have charge transfer structures.

54. An image pickup apparatus according to claim 49, wherein said control means adds charges in said first and second areas to introduce the added charges into said storage part; and wherein said image pickup apparatus further includes suppressing means for suppressing a signal read out from said storage part.

55. An image pickup apparatus according to claim 49, wherein said recombining means recombines a part of said charges in said second area with the majority carrier.

* * * * *

UNITED STATES PATENT AND TRADEMARK OFFICE
CERTIFICATE OF CORRECTION

PATENT NO. : 4,821,105
DATED : April 11, 1989
INVENTOR(S) : AKIRA SUGA ET AL.   Page 1 of 4

It is certified that error appears in the above-identified patent and that said Letters Patent is hereby corrected as shown below:

AT [57] ABSTRACT

Line 9, "binating" should read --bining--.

COLUMN 1

Line 19, "Laid Open" should read --Laid-Open--.
    Line 63, "electrons," should read --electrons)--.

COLUMN 3

Line 1, "a" should read --the--.
    Line 2, "the" should read --a--.

COLUMN 4

Line 52, "cross sectional" should read
        --cross-sectional--.

COLUMN 5

Line 12, "cross sectional" should read
        --cross-sectional--.

COLUMN 7

Line 7, "synchronosly" should read --synchronously--.
    Line 25, "$t_a$," should read --$t_3$,--.
    Line 40, "producted" should read --produced--.

UNITED STATES PATENT AND TRADEMARK OFFICE
CERTIFICATE OF CORRECTION

PATENT NO. : 4,821,105
DATED : April 11, 1989
INVENTOR(S) : AKIRA SUGA ET AL.

It is certified that error appears in the above-identified patent and that said Letters Patent is hereby corrected as shown below:

COLUMN 9

Line 61, "clock drive CKD." should read
        --clock driver CKD.--.

COLUMN 10

Line 67, "dran" should read --drain--.

COLUMN 11

Line 28, "ont" should read --on--.
    Line 54, "an" should be deleted
    Line 58, "almost" should read --most--.
    Line 62, "inoprative" should read --inoperative--.
    Line 68, "power supply VOD." should read
        --power supply $V_{OD}$.--.

COLUMN 12

Line 7, "light receiving parts 1" should read
        --light receiving part 1--.
    Line 18, "frequency divided signals" should read
        --frequency-divided signals--.
    Line 23, "mode setting circuits MS" should read
        --mode setting circuit MS--.
    Line 24, "an an"should read --as an--.
    Line 26, "(hereinbefore," should read --(hereinbelow,--.
    Line 50, "$SEL_1$-L" should read --$SEL_1$=L--.
    Line 67, "almost" should read --most--.

UNITED STATES PATENT AND TRADEMARK OFFICE
CERTIFICATE OF CORRECTION

PATENT NO. : 4,821,105
DATED : April 11, 1989
INVENTOR(S) : AKIRA SUGA ET AL.          Page 3 of 4

It is certified that error appears in the above-identified patent and that said Letters Patent is hereby corrected as shown below:

COLUMN 13

Line 5, "overflow changes" should read
        --overflow charges--.
    Line 22, "$SEL_1$ and" (second occurrence) should be deleted.
    Line 55, "$A_{INT} < 0$." should read --$A_{INT} > 0$.--.

COLUMN 14

Line 41, "recombing means" should read
        --recombining means--.

COLUMN 15

Line 4, "am" should read --an--.
    Line 36, "that" should read --which--.
    Line 37, "that" should read --which--.

COLUMN 16

Line 9, "second area" should read --second areas--.
    Line 19, "plurality" should read --a plurality--.

UNITED STATES PATENT AND TRADEMARK OFFICE
CERTIFICATE OF CORRECTION

PATENT NO. : 4,821,105
DATED : April 11, 1989
INVENTOR(S) : AKIRA SUGA ET AL.                    Page 4 of 4

It is certified that error appears in the above-identified patent and that said Letters Patent is hereby corrected as shown below:

COLUMN 17

Line 20, "recombin ing means" should read
--recombining means--.

Signed and Sealed this

Fifth Day of June, 1990

Attest:

HARRY F. MANBECK, JR.

Attesting Officer     Commissioner of Patents and Trademarks